(12) United States Patent  
Koike et al.

(10) Patent No.: US 9,130,075 B2  
(45) Date of Patent: Sep. 8, 2015

(54) SILVER ELECTRODE-FORMING PASTE COMPOSITION, METHOD OF PRODUCTION THEREOF, AND SOLAR CELL

(71) Applicant: NORITAKE CO., LIMITED, Nagoya-shi, Aichi (JP)

(72) Inventors: Tomohisa Koike, Miyoshi (JP); Shinji Senda, Miyoshi (JP); Masayuki Doizaki, Miyoshi (JP); Tsuyoshi Ishimaru, Miyoshi (JP); Kazutaka Nakayama, Miyoshi (JP)

(73) Assignee: NORITAKE CO., LIMITED, Nagoya (JP)

( * ) Notice: Subject to any disclaimer, the term of this patent is extended or adjusted under 35 U.S.C. 154(b) by 260 days.

(21) Appl. No.: 13/945,325

(22) Filed: Jul. 18, 2013

(65) Prior Publication Data

US 2014/0021417 A1    Jan. 23, 2014

(30) Foreign Application Priority Data

Jul. 18, 2012 (JP) ................................ 2012-159868

(51) Int. Cl.
- H01B 1/22 (2006.01)
- H01L 35/14 (2006.01)
- H01L 31/0224 (2006.01)
- H01L 31/068 (2012.01)

(52) U.S. Cl.
CPC .......... *H01L 31/022425* (2013.01); *H01B 1/22* (2013.01); *H01L 31/068* (2013.01); *Y02E 10/547* (2013.01)

(58) Field of Classification Search
CPC .............. H01B 1/00; H01B 1/16; H01B 1/22; H01L 31/022425; H01L 31/1884; H01L 35/14; H01L 35/24; C03C 8/14; C03C 8/18
See application file for complete search history.

(56) References Cited

U.S. PATENT DOCUMENTS

| | | | |
|---|---|---|---|
| 2011/0095240 A1 | 4/2011 | Nakamura et al. | |
| 2011/0192457 A1 | 8/2011 | Nakayama et al. | |
| 2011/0232746 A1 | 9/2011 | Carroll et al. | |
| 2011/0308595 A1 | 12/2011 | Carroll et al. | |
| 2013/0269772 A1* | 10/2013 | Wang et al. | 136/256 |

FOREIGN PATENT DOCUMENTS

| | | |
|---|---|---|
| JP | A-2011-96747 | 5/2011 |
| JP | B2-4754655 | 8/2011 |
| JP | A-2011-181680 | 9/2011 |
| JP | 2014207262 A * | 10/2014 |

* cited by examiner

Primary Examiner — Mark Kopec  
(74) Attorney, Agent, or Firm — Oliff PLC

(57) ABSTRACT

To provide a paste composition capable of forming a silver electrode having a high bond strength and a low contact resistance, and to provide a solar cell endowed with a high conversion efficiency and excellent reliability, the solar cell including an electrode formed using such a paste composition, a silver electrode-forming paste composition includes a silver powder, a glass component and an organic medium, and the glass component includes tellurium-loaded glass frit which is glass frit having a tellurium compound supported on surfaces thereof. This silver electrode-forming paste composition can be produced by a method which includes the steps of: preparing tellurium-loaded glass frit sintering the mixture in the temperature range of (Tm−35°) C. to (Tm+20°) C.; and dispersing the glass component and the silver powder in an organic medium using the tellurium-loaded glass frit as at least part of the glass component.

13 Claims, 10 Drawing Sheets

[Fig. 1]
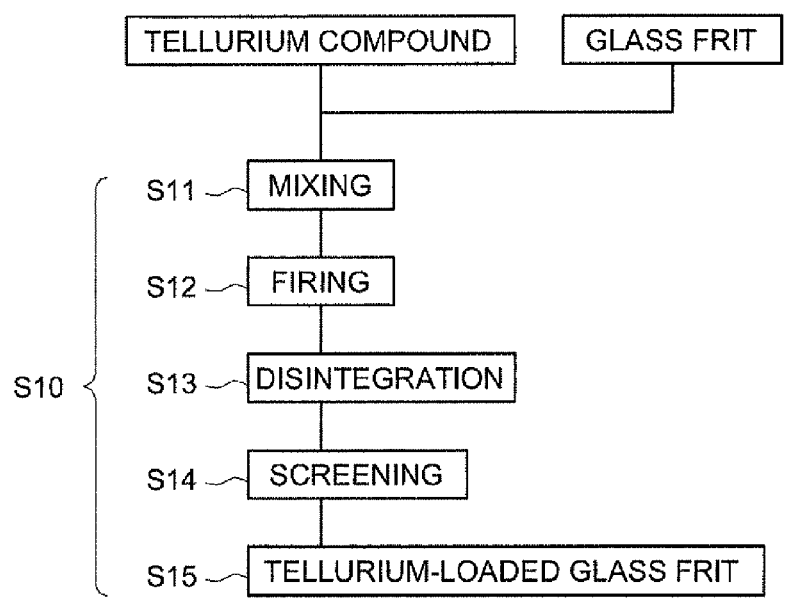

[Fig. 2]
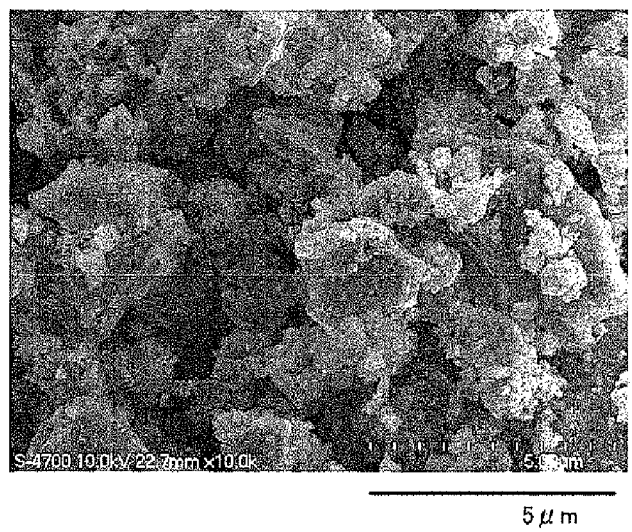
5 μm
[Fig. 3]
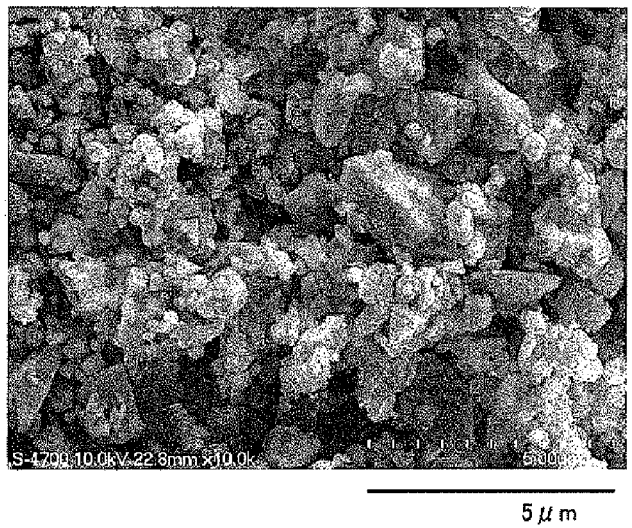
5 μm

[Fig. 4]
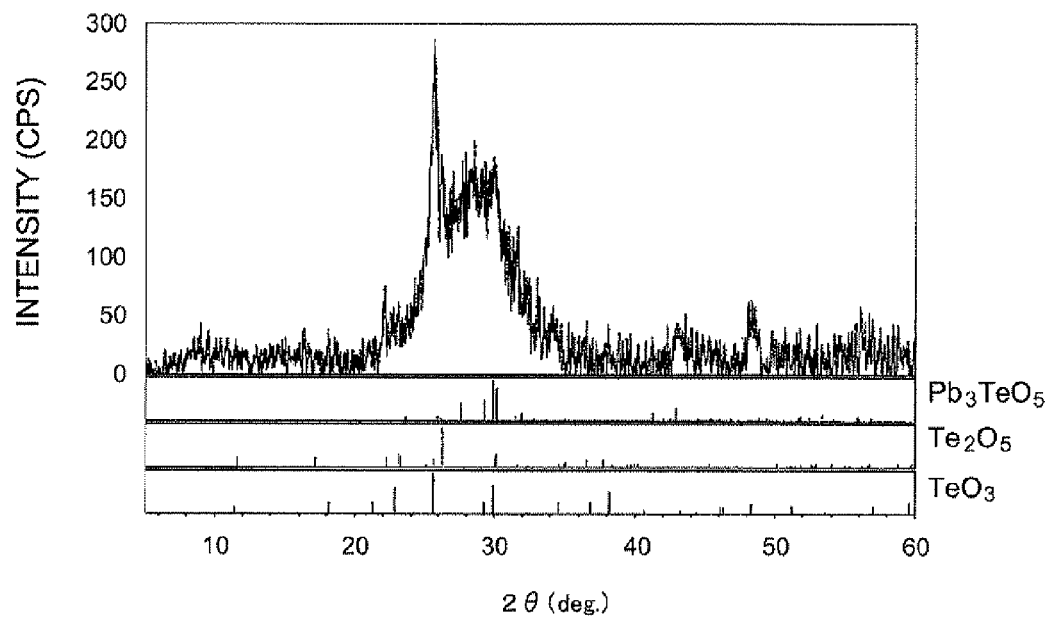
[Fig. 5]
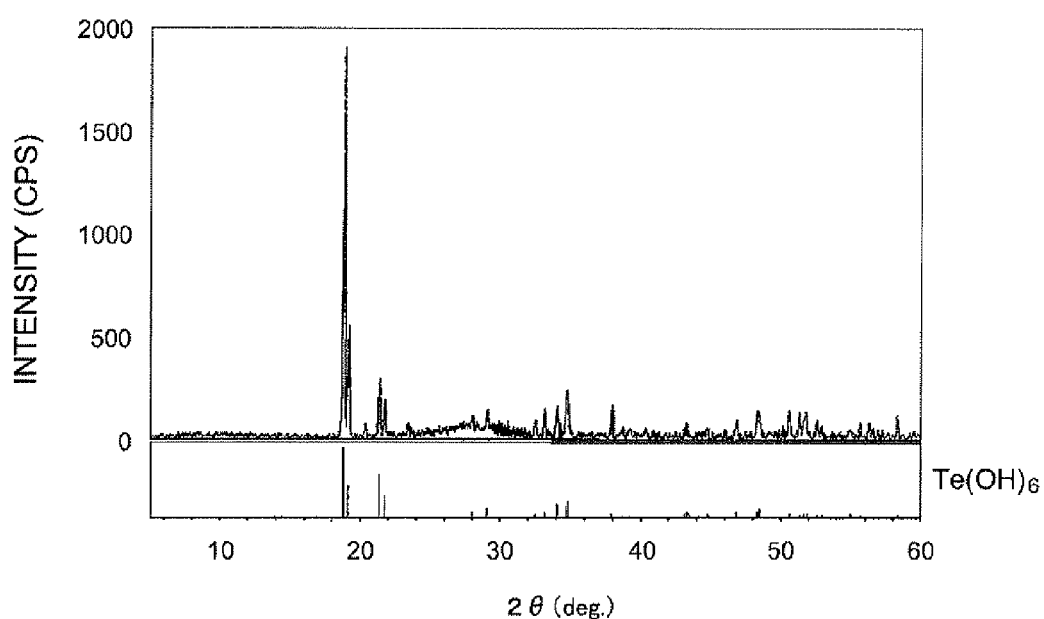

[Fig. 6]
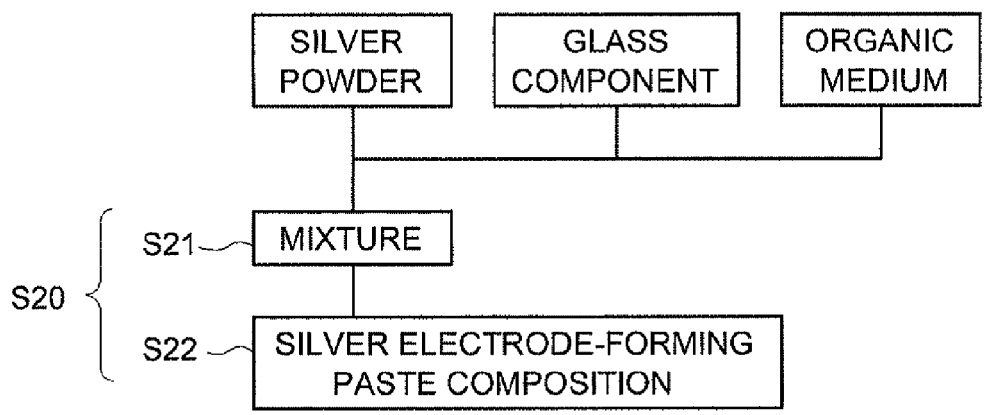
[Fig. 7A]
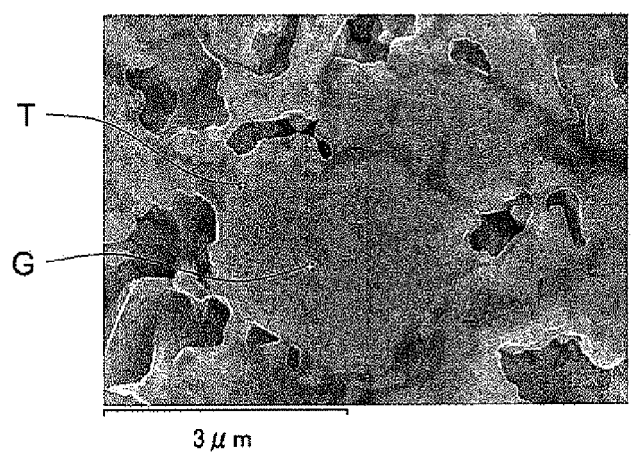

[Fig. 7B]
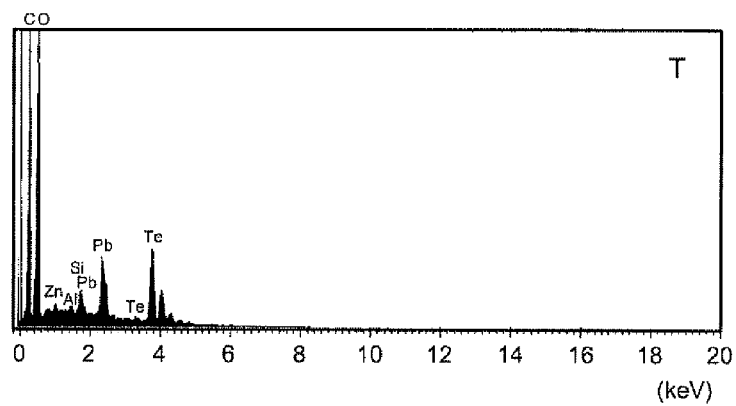
[Fig. 7C]
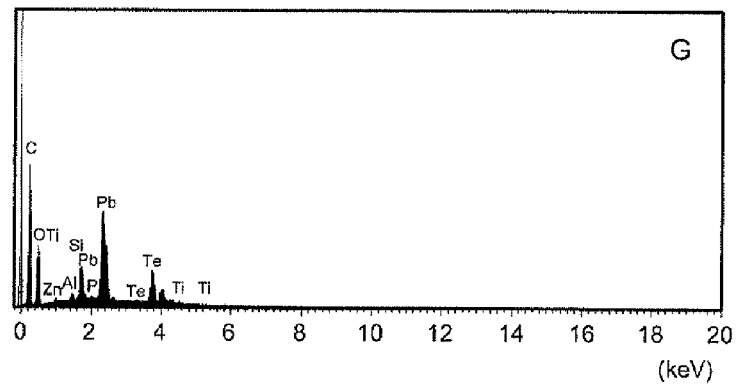

[Fig. 8A]
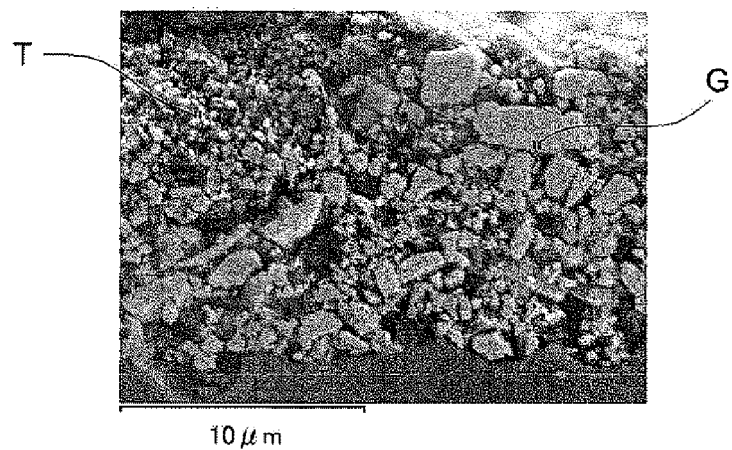
[Fig. 8B]
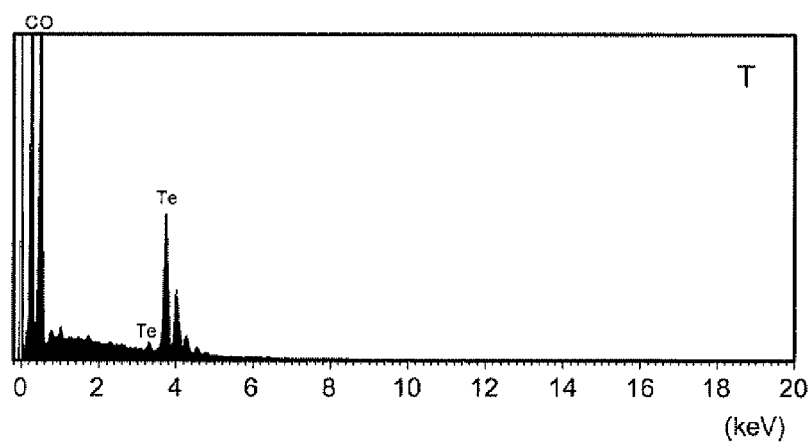

[Fig. 8C]
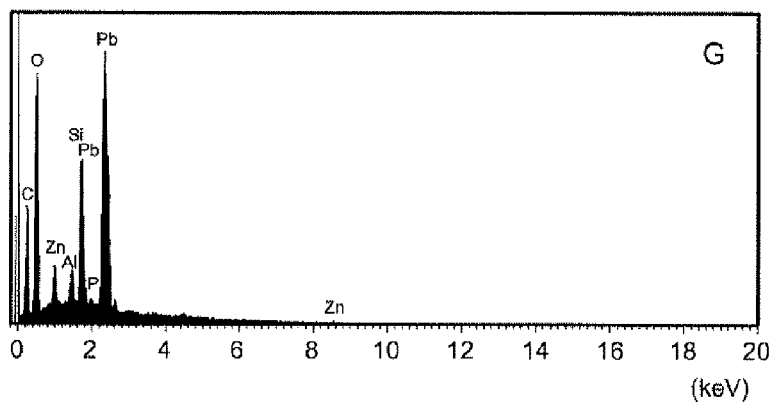
[Fig. 9]
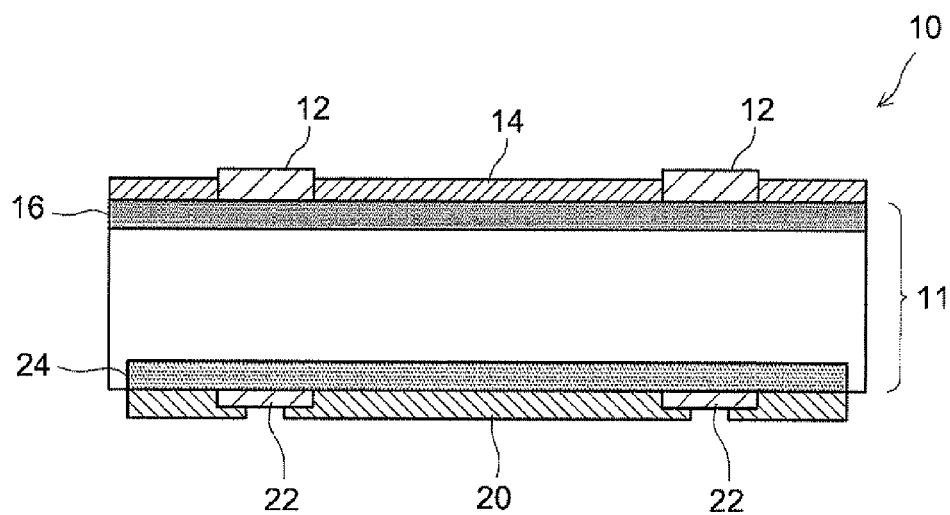

[Fig. 10]
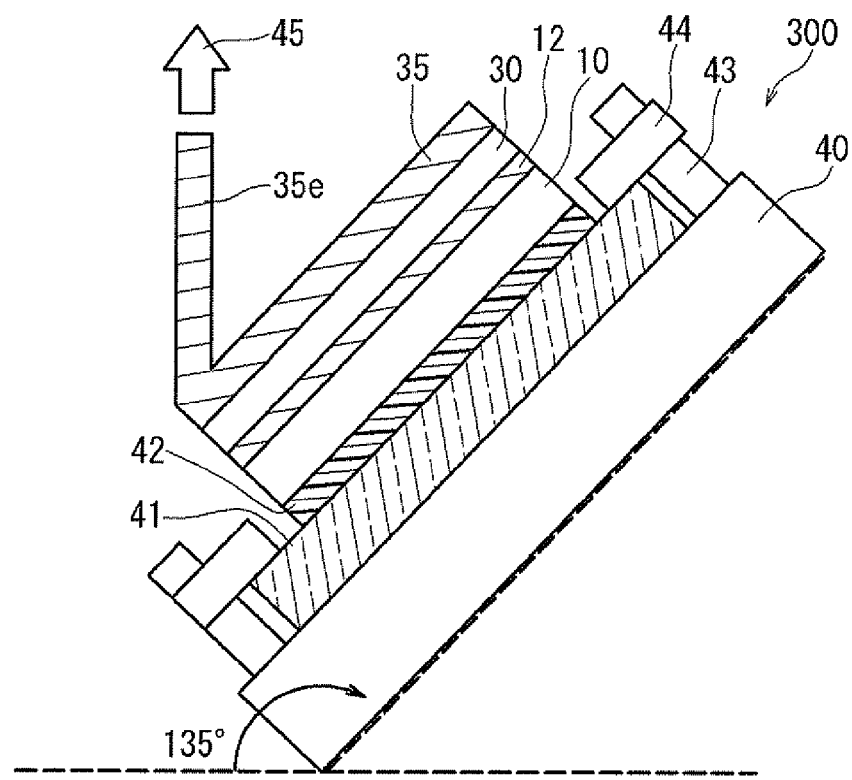

[Fig. 11]
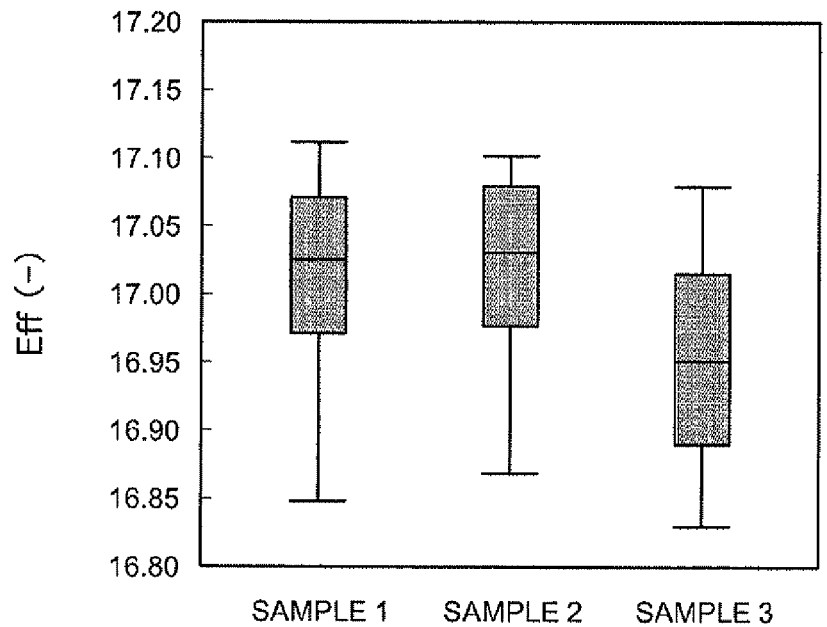
[Fig. 12]
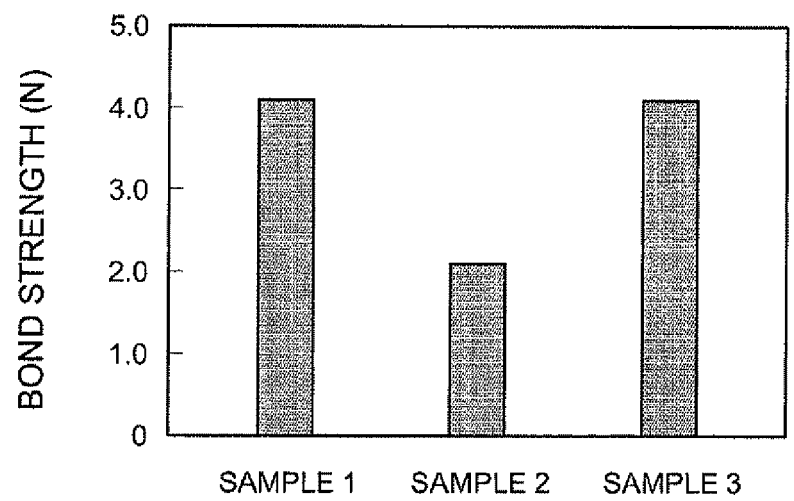

[Fig. 13]
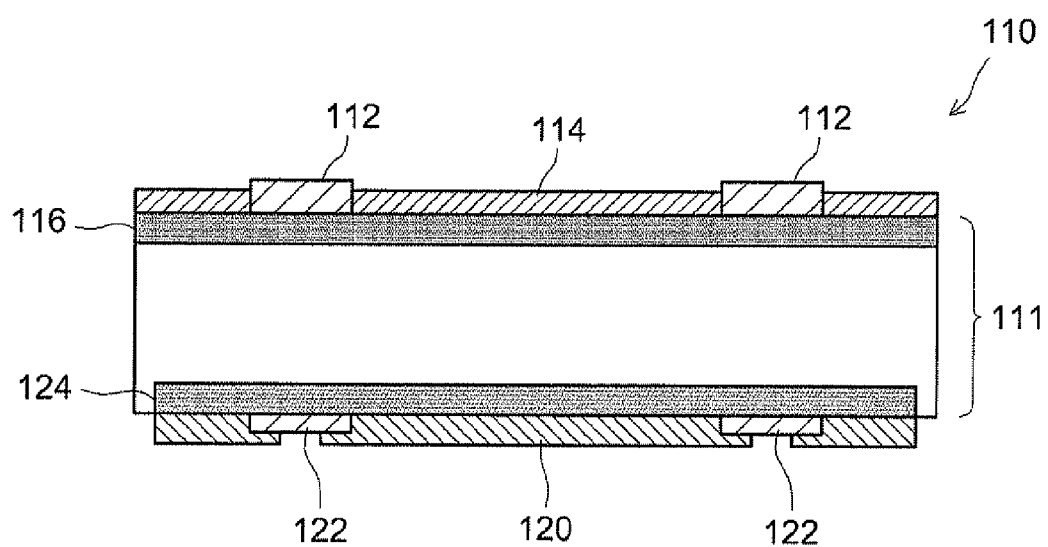

SILVER ELECTRODE-FORMING PASTE COMPOSITION, METHOD OF PRODUCTION THEREOF, AND SOLAR CELL

BACKGROUND OF THE INVENTION

1. Field of the Invention

The invention relates to a silver electrode-forming paste composition for a solar cell, a method of producing such a composition, and a solar cell. More specifically, the invention relates to a silver electrode-forming paste composition for forming a silver (Ag) electrode on the light-receiving surface (front surface) or the back surface side of a crystalline silicon-type solar cell.

This application claims priority to Japanese Patent Application No. 2012-159868 filed on Jul. 18, 2012, the entire contents of which are hereby incorporated by reference.

2. Description of the Related Art

Crystalline silicon solar cells, which are solar cells that use crystalline silicon (monocrystalline or polycrystalline) as the semiconductor substrate, are familiar as typical examples of solar cells for converting the energy of sunlight into electrical power. One such crystalline silicon solar cell is the single-side light-receiving type of solar cell 110 shown in FIG. 13.

This solar cell 110 has an n-Si layer 116 formed by pn junction formation on a light-receiving surface (top surface in FIG. 13) side of a p-type silicon substrate (Si wafer: p-Si layer formed of p-type crystalline silicon) 111, and has, on the n-Si layer 116, an anti-reflective coating 114 that is composed of titanium oxide or silicon nitride and front electrodes (light-receiving surface electrodes) 112 that are composed of silver (Ag). The solar cell 110 also has, on a back surface (bottom surface in FIG. 13) side of the p-type silicon substrate (p-Si layer) 111, back side electrodes for external connection 122 that are composed of silver (Ag) as in the light-receiving surface electrode 112, an aluminum electrode 120 that exhibits a back surface field (BSF) effect, and a p+ layer (BSF layer) 124 that is formed by the diffusion of aluminum to the p-Si layer 111.

One method of forming such a light-receiving surface electrode 112 involves forming an anti-reflective coating 114 by chemical vapor deposition (CVD) or the like over substantially the entire surface of the silicon substrate 111, partially removing with hydrofluoric acid (HF) or the like those areas of the anti-reflective film 114 where the light-receiving surface electrode 112 is to be formed, then printing a paste composition composed primarily of a silver powder (silver paste) in the removed areas and firing the printed paste.

Another known method, referred to as the "fire-through method," involves forming an anti-reflective film 114 over substantially the entire surface of the silicon substrate 111, then applying a silver paste directly onto the areas of this anti-reflective film 114 where the light-receiving surface electrodes 112 are to be formed and firing the applied paste, thereby melting the anti-reflective film 114 below the silver paste and establishing electrical contact between the silver paste and the silicon substrate 111. The silver paste used in this fire-through method is essentially composed of for example, silver powder, a glass component and an organic medium. The glass component within the paste breaks through the anti-reflective film in the course of firing, thereby achieving ohmic contact between the silver ingredient within the paste and the n-Si layer 116. Such a method, compared with an electrode-forming method that entails partial removal of the anti-reflective film 114, is able to reduce the number of operations and presents no risk of mismatching between the removed areas of the anti-reflective film 114 and the light-receiving surface electrode 112 forming positions. Hence, this fire-through method is suitably used to form the light-receiving surface electrodes 112.

SUMMARY OF THE INVENTION

The energy conversion efficiency and other performance attributes of solar cells formed by a fire-through method are to a large degree due to the quality of the ohmic contact formed as described above. That is, the contact resistance between the light-receiving surface electrodes 112 that are formed and the silicon substrate 111 decreases, enabling a high energy conversion efficiency to be achieved. Accordingly, various disclosures on light-receiving surface electrode-forming silver pastes have been made with the aim of improving the ohmic contact and, in turn, increasing the fill factor (FF) and the energy conversion efficiency.

For example, U.S. Patent Application Publication No. 2011/0232746, U.S. Patent Application Publication No. 2011/0308595 and Japanese Patent Application Publication No. 2011-96747 disclose that a good ohmic contact can be achieved by using, as the glass component in silver paste, a glass frit which contains tellurium (Te) as a glass network-forming element.

In addition, Japanese Patent Publication No, 4754655 discloses that, by including from 0.01 to 10 mass % of $TeO_2$ in an electrode-forming conductive paste for solar cell devices which includes conductive particles, an organic binder, a solvent, glass fit and $TeO_2$, an electrode having a low resistance and a large fill factor can be formed.

However, when producing a solar cell module, leads (a leadframe, not shown) for extracting current are soldered to the electrodes (112, 120, 122) on both surfaces of the solar cell (single cell) 110 shown in FIG. 13. Using these leads, a plurality of solar cells 110 are connected in series and modularized, enabling the supply of a given electrical power in this modularized state. Here, from the standpoint of the durability and reliability of the solar cell module, it is important for the bond strength (typically, the soldering strength) between the electrodes and the leads to be assured immediately after bonding and for the duration of long-term use of the solar cell. It was partly to address this concern that, in Japanese Patent Application Publication No. 2011-181680, the solder strength is increased by including at least one of nickel and NiO in a silver paste.

However, the silver pastes disclosed in U.S. Patent Application Publication No. 2011/0232746, U.S. Patent Application Publication No. 2011/0308595 and Japanese Patent Application Publication No. 2011-96747, although capable of forming electrodes having a low contact resistance, are unable to provide a sufficient solder bond strength; hence, an even higher bond strength has been desired. On the other hand, the silver paste disclosed in Japanese Patent Publication No. 4754655 maintains a good bond strength, but fails to achieve a sufficient decrease in the contact resistance. Although the silver paste disclosed in Japanese Patent Application Publication No. 2011-181680 does achieve an improved bond strength compared with U.S. Patent Application Publication No. 2011/0232746, U.S. Patent Application Publication No. 2011/0308595, Japanese Patent Application Publication No. 2011-96747 and Japanese Patent Publication No. 4754655, it still leaves something to be desired in achieving a silver paste that provides both a higher bond strength and a low contact resistance.

It is therefore an object of this invention to provide a paste composition which is capable of forming silver electrodes having a high bond strength and a low contact resistance.

Another object is to provide a method of producing such a paste composition. A further object is to provide a solar cell having a high conversion efficiency and an excellent reliability, which solar cell includes electrodes formed using such a paste composition.

The paste composition provided by the invention so as to achieve the above objects is a silver electrode-forming paste composition (which may be in the form of a slurry or an ink; the same applies below) for a solar cell. This paste composition includes a silver powder, a glass component and an organic medium. The glass component is characterized by including tellurium-loaded glass fit including glass fit and a tellurium compound supported on surfaces of the glass frit.

That is, in this paste composition, the tellurium compound is substantially not included as an independent constituent (e.g., in the state of a tellurium compound powder). In this paste composition, the tellurium compound is included not as a glass component, but rather in a state that is inseparably and integrally bonded with glass frit. As used herein, "glass frit" refers to glass in the form of flakes or a powder which is obtained by, for example, fusing, quenching and, optionally, grinding a glass starting material.

By virtue of this arrangement, the tellurium compound is integrally present with the glass frit within the paste composition and this state is continuously maintained from the time that the silver electrode-forming paste composition is prepared, during application and drying of the paste composition, and up until the glass component fuses due to firing. Such a silver electrode-forming paste composition, compared with silver pastes containing a tellurium compound solely as an independent paste constituent (i.e., a component present in a free state from the glass frit), enables the formation of electrodes which have a low resistance and can achieve a high energy conversion efficiency. Moreover, such a silver electrode-forming paste composition, compared with silver pastes containing glass frit containing tellurium solely as a glass component network former in the glass component, enables the formation of electrodes having a high bond strength. That is, with such a silver electrode-forming paste composition, there is achieved a paste composition which can provide silver electrodes having a high soldering strength and also solar cells having a high conversion efficiency.

In a preferred aspect of the silver electrode-forming paste composition disclosed herein, the tellurium-loaded glass frit is characterized by having at least a glass phase composed primarily of glass that does not include tellurium as a glass network former (network-forming oxide) element and a tellurium compound phase composed primarily of a tellurium compound, the glass phase and the tellurium compound phase being united through an interface.

That is, in a tellurium-loaded glass frit, the tellurium compound is not all incorporated within the glass phase; some forms, as a crystal phase differing from the glass phase, a tellurium compound phase. In the vicinity of interfaces where the glass phase and the tellurium compound phase unite, bonding may form as constituents of the mutual phases diffuse. For instance, consideration may be given to a case in which the glass phase and the tellurium compound phase form diffusion bonding. Here, the glass phase does not include tellurium (Te) as a glass network-forming element, and may include Te or the like as a network modifier (network modifying oxide) near interfaces with the tellurium compound phase. Moreover, the tellurium compound phase may include, near interfaces with the glass phase, glass phase constituents as part of the tellurium compound.

As used in this specification, the expression "composed primarily of" in reference to an ingredient within a composition signifies that the ingredient accounts for more than 50 mass %, preferably at least 70 mass %, and more preferably at least 90 mass %, of the composition.

Therefore, "a glass phase composed primarily of glass which does not include tellurium as a glass network-forming element" means that, in this glass phase, glass which does not include tellurium as a glass network-forming element is included in excess of 50 mass %. For example, near the interface with the tellurium compound phase, there may be areas which include tellurium in the glass phase, although such areas which include tellurium account for less than 50 mass %, preferably 30 mass % or less, and more preferably 10 mass % or less, of the glass phase.

Also, "a tellurium compound phase composed primarily of a tellurium compound" means that, in this tellurium compound phase, a tellurium compound is included in excess of 50 mass %, preferably at least 70 mass %, and more preferably at least 90 mass %. For example, near the interface with the glass phase, there may be areas where glass phase constituents are included in the tellurium compound phase, although the areas which include such glass phase constituents account for less than 50 mass %, preferably 30 mass % or less, and more preferably 10 mass % or less, of the tellurium compound phase.

According to this arrangement, it is possible for the tellurium-loaded glass frit to have come about via the formation of a distinctive phase from the glass component and the tellurium compound by diffusion bonding or the like and, while this is maintained, integration of the glass phase and the tellurium compound phase. Such bonding can be sufficiently strong compared with the state of adhesion achieved by, for example, adsorption. Therefore, whether in a dispersed state within a silver electrode-forming paste composition or in the state that ensues after the paste composition has been subjected to printing and drying, the glass component and the tellurium compound are able to maintain an inseparably united state over an extended period of time. As a result, there is provided a silver electrode-forming paste composition which can more reliably form silver electrodes having a high soldering strength and also is able to achieve solar cells endowed with an excellent conversion efficiency.

In another preferred aspect of the silver electrode-forming paste composition disclosed herein, the tellurium-loaded glass fit is obtained by sintering a mixture of the glass frit and a tellurium starting compound. That is, the tellurium-loaded glass fit disclosed here may be more preferably prepared by sintering a mixture of glass fit and a tellurium starting compound.

In the tellurium-loaded glass frit, the glass component and the tellurium compound are strongly bonded, enabling the above-described optimal state to be maintained over an extended period of time. Hence, with this arrangement as well there is provided a silver electrode-forming paste composition capable of forming silver electrodes endowed with both a strong soldering strength and a low contact resistance.

As used herein, "sintering" refers to sintering and thereby bonding together glass frit and a tellurium compound powder, but does not mean to obtain a dense sintered body of glass frit and tellurium compound. It also includes the release by oxidation of ingredients such as carbonic acid and nitric acid present in the tellurium starting compound.

In yet another preferred aspect of the silver electrode-forming paste composition disclosed herein, letting Tm be the melting point of the glass fit, the mixture is sintered in the temperature range of $(Tm-35)°$ C. to $(Tm+20)°$ C. This arrangement enables the glass fit and tellurium compound to strongly unite with each other while preventing them from excessively fusing. That is, tellurium-loaded frit composed of glass frit having a tellurium compound supported on surfaces thereof is advantageously achieved, providing a silver electrode-forming paste composition which can more stably achieve both a high soldering strength and a low contact resistance.

In still another preferred aspect of the silver electrode-forming paste composition disclosed herein, the tellurium compound in the tellurium-loaded glass frit is supported in a mass ratio per 100 parts by mass of the glass frit, expressed in terms of tellurium oxide ($TeO_2$), of from 20 parts by mass to 60 parts by mass. Setting the proportion of glass frit and tellurium in the above range makes it possible to achieve a high soldering strength and a low contact resistance in a good balance.

In a further preferred aspect of the silver electrode-forming paste composition disclosed herein, the tellurium-loaded glass frit is compounded in a molar ratio with respect to the silver powder, expressed as Ag:Te, in the range of from 1:0.001 to 1:0.1. This arrangement makes it possible to achieve a good balance of properties such as electrical conductivity, high soldering strength and low contact resistance.

In another preferred aspect of the silver electrode-forming paste composition disclosed herein, the diffraction pattern for the glass component obtained by x-ray diffraction analysis includes, within a halo pattern from the glass frit, a peak attributable to the tellurium compound. This arrangement makes it possible to confirm that crystalline tellurium compound is reliably included in at least part of both the glass component and the glass frit. With this arrangement, it is possible to clearly confirm that this silver electrode-forming paste composition is able to achieve both a high soldering strength and a high conversion efficiency.

In yet another preferred aspect of the silver electrode-forming paste composition disclosed herein, the diffraction pattern obtained by x-ray diffraction analysis further includes a peak attributable to a tellurium-containing compound composed of the glass fit and the tellurium compound.

This arrangement makes it possible to confirm that the glass component has a halo pattern indicating the presence of glass frit and a peak attributable to the tellurium compound supported on the glass frit, and includes a tellurium-containing compound which is a reaction product of the glass frit with the tellurium compound. That is, it can be confirmed that the glass frit and the tellurium compound are diffusion bonded through the interface.

In still another preferred aspect of the silver electrode-forming paste composition disclosed herein, at least one type of powder selected from the group consisting of transition metal powders and transition metal oxide powders is additionally included.

By including a transition metal powder, a transition metal oxide powder or the like in the silver electrode-forming paste composition, the bond strength of the electrode film formed with the paste composition is improved and the contact resistance is reduced. Here, transition metal powders and transition metal oxide powders suitable for addition to the silver electrode-forming paste composition are exemplified by powders of Group 4 transition metals and powders of oxides thereof. More preferred examples include powders of nickel (Ni), titanium (Ti), iron (Fe), zinc (Zn), copper (Cu), manganese (Mn) and powders of oxides thereof. Silver electrode-forming paste compositions which exhibit both improved bond strength and a low contact resistance at an even higher level are thereby achieved.

The production method provided according to another aspect of the invention is a method of producing a silver electrode-forming paste composition for a solar cell that includes a silver powder, a glass component and an organic medium. This production method is characterized by including the steps of preparing tellurium-loaded glass frit by mixing together glass frit and a tellurium starting compound and, letting Tm° C. be the melting point of the glass frit, sintering the mixture in the temperature range of (Tm−35)° C. to (Tm+20)° C.; and dispersing the glass component and the silver powder in an organic medium using the tellurium-loaded glass frit as at least part of the glass component.

Here, by sintering the glass frit and the tellurium starting compound in a mixed state within the above-indicated temperature range, the tellurium compound is reliably supported on the surface of the glass frit. By using the tellurium-loaded glass frit prepared in this way as the glass component, a silver electrode-forming paste composition capable of forming silver electrodes having a high bond strength and a low contact resistance can be produced.

In a preferred aspect of the production method disclosed herein, the production method is characterized by further including the step of effecting disintegration of the tellurium-loaded glass frit.

Because the glass frit and the tellurium starting compound mutually bond due to sintering, large agglomerates may form in the production of the paste composition. Although bonding due to sintering is stronger than adhesion due to adsorption or the like, because the glass frit and the tellurium starting compound are bonded in a mixed state with gaps remaining therein, these agglomerates can be reduced in size to a desired particle size by mild disintegration (such as crushing by hand, or light mixing using a mortar and pestle). Accordingly, production to a particle size appropriate for preparing a paste composition (e.g., about 0.1 μm to about 5 μm) is possible without using special equipment such as a ball mill or grinding machine.

The solar cell provided in yet another aspect of the invention is characterized by having an electrode formed using any of the above-described silver electrode-forming paste compositions. By using the silver electrode-forming paste composition disclosed herein, silver electrodes having a low contact resistance and a high bond strength can be formed. As a result, solar cells having such silver electrodes are capable of being endowed with a high energy conversion efficiency, a long service life and excellent reliability.

In a preferred aspect of the solar cell disclosed herein, the electrode is a light-receiving surface electrode. Because the silver electrode-forming paste composition disclosed herein contains glass frit as the glass component, it can be advantageously used in light-receiving surface electrodes obtained by the fire-through method. With such an arrangement, a high quality ohmic contact can be formed, enabling a solar cell endowed with a high energy conversion efficiency, a long service life and good reliability to be achieved.

BRIEF DESCRIPTION OF THE DRAWINGS

FIG. 1 is a flow chart showing an example of the preparation of tellurium-loaded glass frit;

FIG. 2 is a scanning electron microscopic (SEM) image of a tellurium-loaded glass frit;

FIG. 3 is a SEM image of a mixture of telluric acid and glass frit;

FIG. 4 shows an x-ray diffraction pattern for a tellurium-loaded glass frit;

FIG. 5 is an x-ray diffraction pattern for a mixture of telluric acid and glass frit;

FIG. 6 is a flow chart showing the steps in the production of a silver electrode-forming paste composition according to an embodiment of the invention;

FIG. 7A is a SEM image of a coat A in an example of the invention;

FIG. 7B is an energy-dispersive x-ray diffraction (EDX) spectrum at point T in FIG. 7A;

FIG. 7C is an EDX spectrum at point G in FIG. 7A;

FIG. 8A is a SEM image of a coat B in an example of the invention;

FIG. 8B is an EDX spectrum at point T in FIG. 8A;

FIG. 8C is an EDX spectrum at point G in FIG. 8A;

FIG. 9 is a cross-sectional diagram schematically showing an example of the construction of a solar cell built using the silver electrode-forming paste composition of the invention;

FIG. 10 is a side view illustrating the manner in which a bond strength test is conducted;

FIG. 11 is a graph showing the energy conversion efficiency (Eff) of the solar cells in Samples 1 to 3;

FIG. 12 is a graph showing the bond strengths of the silver electrode films formed using the paste compositions in Samples 1 to 3; and FIG. 13 is a cross-sectional diagram schematically showing an example of the construction of a solar cell built using a conventional silver paste composition.

DESCRIPTION OF THE PREFERRED EMBODIMENTS

A detailed description of preferred embodiments of the present invention is provided below. Note that technical matters which are required for carrying out the present invention but are not particularly mentioned in the present specification (such as the method of applying the paste composition to a substrate, the method of firing the paste composition, and the structure of the solar cell) are matters of design variation that could be apprehended by a person skilled in the art based on prior art. The present invention can be carried out based on the technical details disclosed in the present specification and on common general technical knowledge in the field in question.

Silver Electrode-Forming Paste Composition

The paste composition disclosed herein is a silver electrode-forming paste composition that can be used in applications that involve forming silver (Ag) electrodes in solar cells. The paste composition includes a silver powder and a glass component as the solids, and is prepared by dispersing these solids in an organic medium. Moreover, this silver electrode-forming paste composition is characterized in that the glass component includes tellurium-loaded glass fit which is a glass frit having a tellurium compound supported on surfaces thereof. Provided the objects of the invention are attainable, no strict limitations are imposed on other constituents and the contents (proportions) thereof. Moreover, the inclusion of various types of additives such as dispersants hitherto commonly used in this type of paste composition is allowed.

Silver Powder

The silver powder included as the primary solid in the paste compositions disclosed herein is a collection of particles composed primarily of silver, and is typically a collection of particles composed of silver alone. However, even in cases where the silver powder includes a trace amount of impurities other than silver or alloy (particles) composed primarily of silver, such a powder, provided it is overall a collection of particles composed primarily of silver, may be encompassed by the term 'silver powder' as used herein. Such a silver powder may be one produced by a known production method, there being no need for a special mode of production.

The shape of the particles making up this silver powder is not particularly limited. Typically, the particles are spherical, although the shape is not limited to one that is perfectly spherical. Examples of suitable non-spherical particle shapes include flake-like shapes and irregular shapes. The silver powder may be composed of such particles of various shapes. In cases where the silver powder is composed of particles having a small average particle size (e.g., a size of several micrometers), it is preferable for at least 70 mass % of the particles (primary particles) to be spherical or to have a shape that is similar thereto. For example, a silver powder in which at least 70 mass % of the particles making up the silver powder have an aspect ratio (i.e., the ratio of the long axis to the short axis of the particle) of from 1 to 1.5 is preferred.

In cases where a silver electrode that is to serve as a light-receiving surface electrode is formed on one surface (typically the light-receiving surface, but it may be the back surface) of a substrate (e.g., a silicon substrate) making up a solar cell, factors such as the coating weight of the paste composition and the manner of coating the composition may be taken into consideration in order to achieve the desired dimensions (linewidth, film thickness, etc.) and shape. Here, the preferred silver powder for forming such a light-receiving surface electrode on a solar cell is not particularly limited, although it is suitable for the average diameter of the particles making up the powder to be not more than 20 μm, preferably at least 0.01 μm but not more than 10 μm, and more preferably at least 0.3 μm but not more than 5 μm, such as 2 μm±1 μm. Here, "average particle diameter" refers to the particle diameter at 50% of the cumulative volume, or D50 (median diameter), in the particle size distribution measured by laser diffraction scattering method.

For example, use may be made of a silver (mixed) powder of the sort obtained by mixing together a plurality of silver powders (typically two types) having mutually differing average particle diameters so that the average particle diameter of the mixed powder falls within the above range. By using a silver powder having such an average particle diameter, dense silver electrodes suitable for use as light-receiving surface electrodes can be formed.

The content of the above silver powder in the paste composition disclosed herein is not particularly limited. However, letting the paste composition overall be 100 mass %, it is advantageous to adjust the silver powder content so as to be preferably at least 40 mass % but not more than 95 mass %, and more preferably at least 60 mass % but not more than 90 mass %, such as at least 70 mass % but not more than 80 mass %. When the silver powder content within the paste composition that has been produced falls within the above range, a silver electrode (film) having a high electrical conductivity and an enhanced density can be formed.

Glass Component

Of the solids within the paste composition disclosed herein, the glass component included as an auxiliary component is an ingredient essential for forming, by a fire-through method from above the anti-reflective coating, silver electrodes as light-receiving surface electrodes for a solar cell, and also is an inorganic additive which enhances the bond strength of the silver electrodes to the substrate. Moreover, in the present invention, because the glass component includes tellurium-loaded glass frit which is glass frit having a tellurium compound supported on surfaces thereof, this has the effect of further increasing the bond strength of the silver electrodes and reducing the contact resistance.

In this tellurium-loaded glass frit, the tellurium compound, while being inseparably and integrally bonded with the glass frit, is included not as a ingredient making up the glass but rather as a crystal phase. By way of illustration, it is possible for one single tellurium compound particle or a plurality of such particles to bond to a single piece of flake-like or powder-like glass frit and to thereby be supported on the glass frit. A plurality of glass fit pieces that support tellurium compound particles may bond together. There is particular no limitation here on the relative sizes of the glass frit and the tellurium compound particles; one may be made larger, or both may be made about the same size. The relationship between their relative positions is important.

Turning to the structure of this tellurium-loaded glass frit, the tellurium-loaded glass fit has a structure in which a glass phase and a crystalline tellurium compound phase are united through an interface. Here, the glass phase is composed primarily of glass which does not include tellurium as a glass network-forming element. That is, the glass phase may contain tellurium, although the tellurium can be included not as a glass network former but rather as a network modifier. Also, the tellurium compound phase is a crystalline substance and composed primarily of tellurium compound, and thus is clearly distinguishable from the glass phase in that it has a crystal structure. The glass phase may be composed of one type of glass phase, or a plurality of glass phases may be present. Likewise, the tellurium compound phase may be composed of one type of tellurium compound phase, or a plurality of tellurium compound phases may be present. For example, a single glass phase may be united with a plurality of tellurium compound phases of differing compositions, or a plurality of glass phases of differing compositions may be united with a plurality of tellurium compound phases of differing compositions.

Because it is possible for the ingredients of the glass phases and the tellurium compound phases to mutually diffuse at the bond interface, ingredients of each may be present near the interface. Typically, the glass phase may include tellurium near the interface with the tellurium compound phase, but may well be in a state free of tellurium near the center of the glass phase. Depending on the size of the glass phase, a state which includes tellurium near the center is also conceivable, although it will be appreciated that in such cases as well, tellurium is not present as a glass network former (i.e., as part of the glass skeleton).

Also, the tellurium compound phase may include a glass phase constituent near the interface with the glass phase. In such a case, the glass phase constituent is included as one constituent of the tellurium compound.

That is, in tellurium-loaded glass frit, the glass phase and the tellurium compound phase bond through the interface and ingredients of each are able to diffuse near the interface, but one phase is not included in the other phase. Rather, the phases exist substantially as independent and differing phases.

The characteristic composition of the above tellurium-loaded glass frit can easily be confirmed by x-ray diffraction analysis of the glass component of this silver electrode-forming paste composition. That is, in the x-ray diffraction pattern of tellurium-loaded glass frit composed as described above, a crystalline peak is observed within a distinctive broad peak called the halo pattern originating in the glass phase. This crystalline peak typically matches the tellurium compound supported on the glass fit. Moreover, in cases where, at the interface between the tellurium compound phase and the glass phase, constituents of the glass fit have diffused into the tellurium compound phase, peaks of compounds (tellurium-containing compounds) formed of ingredients in the tellurium compound and ingredients in the glass frit are sometimes detected. For example, in cases where a lead-based glass is used as the glass frit, in addition to peaks attributable to tellurium oxides such as TeO, $Te_2O_5$ and $TeO_3$, peaks attributable to tellurium-containing oxides such as $Pb_3TeO_5$ can typically be observed. Thus, the x-ray diffraction pattern of tellurium-loaded glass fit may typically include, owing to its characteristic structure, a halo pattern indicating the presence of glass fit, a peak attributable to a tellurium compound supported on glass fit, and a peak attributable to a tellurium-containing compound composed of a glass fit ingredient and a tellurium compound ingredient.

The characteristic structure of such a tellurium-loaded glass frit can be confirmed not only by x-ray diffraction analysis, but also by carrying out, for example, energy-dispersive x-ray (EDX) analysis.

In this tellurium-loaded glass fit, the shape of the glass frit supporting the tellurium compound (which may be a glass phase; the same applies below) is not particularly limited, and may typically be flake-like or powder-like glass obtained by, for example grinding glass. The composition also is not particularly limited, and may be made similar to the compositions of glass frits hitherto used in silver electrode-forming paste.

Examples of such glass frits include those composed of lead-based, zinc-based, borosilicate and alkali glasses, as well as glasses containing barium oxide and bismuth oxide, or combinations of two or more thereof. These are exemplified more concretely by glass fits having the following representative compositions (oxide equivalent compositions; the overall glass frit being 100 mol %).

Lead-Based Glass:
46 to 57 mol % PbO; 1 to 7 mol % $B_2O_3$; 38 to 53 mol % $SiO_2$ Li-Containing Lead-Based Glass:
0.6 to 18 mol % $Li_2O$; 20 to 65 mol % PbO; 1 to 18 mol % $B_2O_3$; 20 to 65 mol % $SiO_2$ Lead-Free Glass:
10 to 29 mol % $Bi_2O_3$; 15 to 30 mol % ZnO; 0 to 20 mol % $SiO_2$; 20 to 33 mol % $B_2O_3$; 8 to 21 mol % ($Li_2O$, $Na_2O$, $K_2O$)

The above compositions are only representative; needless to say, the various ingredients may be adjusted and further glass modifying ingredients added in order to, for example, obtain good adhesion with the substrate, good electrode film formability, erodability to the reaction anti-reflective film, and good ohmic contact.

The tellurium compound supported on the glass fit is not subject to any particular limitation and may be an inorganic compound such as a compound with a metal, an oxide, an oxo acid, a hydroxide, a halide, a sulfate, a phosphate, a nitrate, a carbonate, an acetate or a metal complex (coordination compound); an organic compound such as a telluride, telluroxide or tellurone; or a mixture or composite of any of the above. Typical examples include tellurium oxides of the general formulas $TeO_2$, $Te_2O_3$, $Te_2O_5$ and $TeO_3$.

Nor is any particular limitation imposed on the ratio of tellurium compound supported on the glass fit. For example, as a general rule, the above tellurium compound is supported in an amount per 100 parts by mass of glass fit, expressed as the tellurium oxide ($TeO_2$) equivalent, of preferably from 20 parts by mass to 60 parts by mass, and more preferably from about 30 parts by mass to about 50 parts by mass.

With a tellurium-loaded glass fit of the above composition, the tellurium compound appears to be present in an optimal state within the paste composition; that is, not too homogeneous with the glass frit, nor too inhomogeneous, and not too close nor too far. This optimal state is continuously maintained from the time the silver electrode-forming paste composition is prepared, during the period that the paste composition is applied and dried, and up until the glass component fuses as a result of firing. With such a silver electrode-forming paste composition, compared with a silver paste containing a tellurium compound as an independent paste constituent, it is possible to form an electrode capable of achieving a high energy conversion efficiency at a low resistance. Moreover, with such a silver electrode-forming paste composition, compared with a silver paste which contains as the glass component a glass frit that includes tellurium as a network former, an electrode having a high bond strength can be formed. That is, a silver electrode having both a high bond strength (e.g., solder strength) and a low contact resistance can be formed.

It is not always essential for the glass component in the paste composition disclosed herein to entirely consist of the above-described tellurium-loaded glass fit; use in admixture with glass frit that is used in conventional silver electrode-forming pastes is also possible. However, the tellurium-loaded glass fit accounts for a proportion of the glass component which is preferably at least 70 mass %, more preferably at least 90 mass %, and even more preferably at least 95 mass % (that is, substantially about 100 mass %).

In order to stably fire and anchor (bake on) the paste composition (film) applied onto the substrate (e.g., a silicon substrate), it is preferable for the tellurium-loaded glass frit included in the paste composition to have a specific surface area, as determined by the BET method, of at least about 0.1 $m^2/g$ but not more than 10 $m^2/g$. The average particle size is preferably at least 0.01 µm but not more than 10 µm, and more preferably at least 0.1 µm but not more than 5 µm.

No particular limitation is imposed on the content of the glass component. For example, letting the overall paste composition be 100 mass %, it is suitable for this content to be typically from about 0.5 mass % to 10 mass %, preferably from 0.5 mass % to 5 mass %, and more preferably from 1 mass % to 3 mass %.

That is, the tellurium-loaded glass frit is preferably compounded in a molar ratio relative to the silver powder, expressed as Ag:Te, of preferably from 1:0.001 to 1:0.1, and more preferably from 1:0.001 to 1:0.02.

Transition Metal Powder and Transition Metal Oxide Powder

The paste composition disclosed herein may additionally include, as solids, at least one of a transition metal powder and a transition metal compound powder. The transition metal powder and transition metal oxide powder may be an uncombined element belonging to group 3 to group 11 of the periodic table, or an oxide thereof, in the form of a powder. Powders of the first transition elements (3d transition elements) scandium (Sc), titanium (Ti), vanadium (V), chromium (Cr), manganese (Mn), iron (Fe), cobalt (Co), nickel (Ni), copper (Cu) and zinc (Zn), either in uncombined form or as oxides thereof, may typically be considered for this purpose. Powders of nickel, titanium and manganese, either in uncombined form or as oxides thereof, are more preferred, with nickel or NiO being especially preferred. Any one of these powders may be included singly, or combinations of two or more may be included.

It is suitable for the average particle diameter of the particles making up these powders to be at least 1 nm but not more than 200 nm, preferably at least 5 nm but not more than 200 nm, and more preferably at least 15 nm but not more than 200 nm.

Letting the amount of the paste composition as a whole be 100 mass %, the content of these transition metal powders and transition metal oxide powders may be set, as a rule, to not more than about 0.5 mass %, preferably from 0.001 mass % to 0.5 mass %, and more preferably from 0.001 mass % to 0.1 mass %.

Organic Medium

The paste composition disclosed herein, in addition to including, as solids, a silver powder of the sort described above, a glass component and, where necessary, powders of transition metals, transition metal oxides and the like, also includes an organic medium (typically a vehicle) for dispersing these solids. The organic medium should be one capable of properly dispersing in particular the silver powder; any such organic medium hitherto used in this type of paste may be used without particular limitation. For example, use may be made of any one or combination of high-boiling organic solvents such as ethylene glycol and diethylene glycol derivatives (glycol ether-type solvents), toluene, xylene, butyl carbitol (BC) and terpineol as the solvent making up the organic medium.

The vehicle may include various resin components as the organic binder. The resin ingredient should be one that is able to confer the paste composition with a good viscosity and film-forming ability (adhesion to the substrate); any such resin component hitherto used in this type of paste may be used without particular limitation. Illustrative examples include resin components composed primarily of an acrylic resin, epoxy resin, phenolic resin, alkyd resin, cellulose-based polymer, polyvinyl alcohol or rosin-based resin. Of these, a cellulose-based polymer such as ethyl cellulose is especially preferred.

It is suitable for this organic medium to account for a proportion of the overall paste composition which is at least 5 mass % but not more than 60 mass %, preferably at least 7 mass % but not more than 50 mass %, and more preferably at least 10 mass % but not more than 40 mass %. It is desirable for the organic binder in the vehicle to be included in a proportion, relative to the overall paste composition, of preferably at least about 1 mass % but not more than about 10 mass %, and more preferably at least about 1 mass % but not more than about 7 mass %. Including the organic medium in this proportion is desirable because a film of uniform thickness is easily formed (applied) as a silver electrode (film) on a substrate, handling is easy, and drying of the silver electrode film prior to firing can be suitably effected without taking a long time.

The above silver electrode-forming paste can be suitably prepared by, for example, the production method disclosed herein. That is, the method of producing a silver electrode-forming paste composition provided in this invention includes the following steps.

S10: The step of preparing a tellurium-loaded glass frit by mixing together glass frit and a tellurium starting compound and, letting Tm° C. be the melting point of the glass frit, sintering the mixture in the temperature range of (Tm−35)° C. to (Tm+20)° C.

S20: The step of dispersing the glass component and the silver powder in an organic medium using the tellurium-loaded glass fit as at least part of the glass component.

FIG. 1 shows the sequence of operations in the step of preparing tellurium-loaded glass frit (S10) according to one embodiment of the invention. FIG. 6 shows the sequence of operations (S20) in the production of a silver electrode-forming paste composition according to one embodiment of the invention. The method of producing a silver electrode-forming paste composition is explained below while referring to the diagrams.

Preparation of Tellurium-Loaded Glass Frit

In the method of producing a silver electrode-forming paste composition disclosed herein, first, as shown in Step S10 of FIG. 1, glass fit and a tellurium starting compound are mixed together (S11) and this mixture is sintered (S12) so as to prepare a tellurium-loaded glass frit (S13).

As mentioned above, glass frit like that used in conventional silver electrode-forming pastes may be used here without particular limitation as the glass frit.

The tellurium starting compound used may typically be any material which is able to form a tellurium compound or maintain a tellurium compound when sintered in a suitable atmosphere. Such tellurium starting compounds are exemplified by, for example, the various tellurium compounds mentioned above. Illustrative examples include the following inorganic compounds: metal tellurides such as zinc telluride, cadmium telluride, mercury telluride, lead telluride, bismuth telluride and silver telluride, tellurium oxides such as tellurium dioxide and tellurium trioxide, oxo acids and salts thereof, such as orthotelluric acid and tellurous acid, hydroxides such as tellurium hydroxide, halides such as tellurium chloride and tellurium tetrabromide, salts such as ditelluryl sulfate and tellurium phosphate, and also telluric acid, metatelluric acid and salts thereof; the following organic compounds: tellurides such as diaryl tellurides, telluroxides such as bis(4-methoxyphenyl)telluroxide, and tellurones such as methyl phenyl tellurone; and mixtures or composites of any of the above. Preferred use can typically be made of a tellurium oxide such as $TeO_2$, $Te_2O_3$, $Te_2O_5$ or $TeO_3$, telluric acid ($Te(OH)_6$) and tellurous acid ($H_2TeO_3$), and salts thereof.

As indicated in Step S11, these are uniformly mixed, following which, as indicated in Step S12, they are typically sintered in an oxidizing atmosphere (e.g., an open-air atmosphere) within a temperature range of $(Tm-35)°$ C. to $(Tm+20)°$ C. A sintering temperature in excess of $(Tm+20)°$ C. is undesirable because fusing of the glass frit proceeds and the tellurium compound ends up being incorporated (dissolving) into the glass phase. The sintering temperature is more preferably not more than $(Tm+15)°$ C., and even more preferably not more than $Tm°$ C. (i.e., not more than the melting point of the glass frit). A sintering temperature lower than $(Tm-35)°$ C. is undesirable because there is an increased possibility that the tellurium compound cannot be reliably supported. The sintering temperature is preferably at least $(Tm-30)°$ C., and more preferably at least $(Tm-20)°$ C. By setting the sintering temperature within this range, it is possible to prepare the tellurium-loaded glass frit disclosed herein.

There may be cases in which the tellurium-loaded glass frit obtained as a sintered product after sintering has sintered overall to form large agglomerates. In such a case, these agglomerates, by being subjected to disintegration as indicated in Step S13 and, where necessary, screened as indicated in Step S14, may be rendered into a material having a particle size suitable for preparation of the paste composition (e.g., from about 0.01 µm to 10 µm). Although bonding due to sintering is stronger that adhesion by adsorption or the like, because the glass fit and the tellurium starting compound are sintered in a mixed state with gaps therein, these agglomerates can easily be reduced to the desired particle size by mild disintegration (such as crushing by hand, or light mixing using a mortar and pestle) without using special equipment such as a ball mill or grinding machine.

Dispersion in Organic Medium

Next, as shown in Step S20 in FIG. 6, using the tellurium-loaded glass frit prepared as described above as at least part of the glass component, the glass component and silver powder are dispersed in an organic medium.

Dispersion of these solid materials in an organic medium can be easily carried out by, as shown in Step S21, mixing together these materials. These operations may be typically carried out using, for example, a three-roll mill or some other kneader to mix and stir the silver powder and the glass component in a predetermined ratio together with a vehicle. In cases where the above-mentioned transition metal powder or transition metal oxide powder is added to this paste composition, these powders may be mixed together with the silver powder, glass component and the like. When the above materials are mixed together, all the materials may be mixed together at the same time, or they may be added in two or more divided portions. Alternatively, a dispersion obtained by dispersing a portion of the materials in a medium such as an aqueous solvent or an alcohol may be mixed together beforehand. As indicated in Step S22, a silver electrode-forming paste composition can thus be prepared.

Production of Silver Electrode

The silver electrode-forming paste composition disclosed herein that is obtained as described above can be handled in the same way as silver pastes that have hitherto been used to form silver electrodes as light-receiving surface electrodes. That is, a method known to the art may be used without particular limitation to form silver electrodes from the silver electrode-forming paste composition disclosed herein. For example, in cases where silver electrodes (light-receiving surface electrodes 12) in the solar cell 10 shown in FIG. 9 are to be formed by the fire-through method, an $n^+$ layer 16 and an anti-reflective coating 14 are formed on the light-receiving surface of the substrate, following which this silver electrode-forming paste composition is supplied (applied) onto the anti-reflective coating 14 to a desired film thickness (e.g., about 20 µm) and in a desired coating pattern. Supply of the paste composition may be carried out by, for example, screen printing, dispenser coating or dip coating. The substrate is preferably a silicon (Si) substrate 11, and is typically a silicon wafer. The thickness of the substrate 11 may be set while taking into account the size of the desired solar cell, the film thicknesses of the silver electrodes 12, back surface electrodes 20, anti-reflective coating 14 and the like formed on the substrate 11, and the strength (e.g., breaking strength) of the substrate 11. The substrate thickness is generally set to at least 100 µm but not more than 300 µm, and preferably at least 150 µm but not more than 250 µM, such as at least 160 µm but not more than 200 µm. This paste composition may be used also on a substrate 11 having a shallow emitter structure with a thin $n^+$ layer 16 and a low dopant concentration.

In cases where a fire-through method is not used, after the $n^+$ layer 16 and the anti-reflective coating 14 have been formed on the light-receiving surface of the substrate 11, this anti-reflective coating 14 is stripped off in the desired silver electrode pattern, and the silver electrode-forming paste composition is supplied to the desired film thickness in these stripped areas.

Next, the applied paste is dried at a suitable temperature (e.g., room temperature or above, and typically about 100° C.). After drying, firing of the dried coating is carried out by heating for a predetermined time in a suitable kiln (e.g., a high-speed kiln) and under suitable heating conditions (e.g., at least 600° C. but not more than 900° C., and preferably at least 700° C. but not more than 800° C.). The applied paste is thereby baked onto the substrate 11, resulting in the formation of a silver electrode 12 like that shown in FIG. 9.

As described above, the silver electrode-forming paste composition disclosed herein includes tellurium compound-loaded glass frit as the glass component. The silver film obtained from this silver electrode-forming paste composition has a lower contact resistance than a silver film obtained from a paste composition which includes tellurium compound by itself, as a result of which it is possible to manufacture solar cells having a high energy conversion efficiency. Moreover, the silver film obtained from this silver electrode-forming paste composition has a higher bond strength than a silver film obtained from a paste composition containing a tellurium ingredient as a glass network former, as a result of which it is possible to manufacture solar cells having a high durability and reliability. Therefore, solar cells having excellent solar cell characteristics (e.g., a fill factor of at least 78.3%, and a silver electrode bond strength of at least 4 N) can be achieved with this paste composition.

Solar Cell Manufacture

The materials and process used to manufacture solar cells, other than forming silver electrodes (typically, light-receiving surface electrodes) using the silver electrode-forming paste composition disclosed herein, may be exactly the same as in the conventional art. Moreover, it is possible, without carrying out special treatment, to manufacture solar cells (typically, crystalline silicon-type solar cells) having silver electrodes formed using this paste composition. A typical example of the construction of such a crystalline silicon solar cell is shown in FIG. 9.

Processes other than silver electrode formation include forming an aluminum electrode 20 as the back surface electrode 20. The sequence of operations in the formation of such an aluminum electrode 20 is as follows. For example, first, as described above, a silver electrode-forming paste composition for forming light-receiving surface electrodes 12 is printed on the light-receiving surface, a silver paste for forming a back-surface electrode 22 for external connection (this may be the silver electrode-forming paste composition disclosed herein) is printed in a desired region on the back surface as well, and the printed paste compositions are dried. Next, an aluminum electrode paste material is printed so as to overlap part of the silver paste-forming region on the back surface and is dried, following which firing of all the applied films is carried out, thereby forming both an aluminum electrode 20 and a back-surface electrode 22 for external connection. Generally, a P$^+$ layer (BSF layer) 24 may also be formed together with firing of the of the aluminum electrode 20. That is, together with the formation, by firing, of an aluminum electrode 20 as the back-surface electrode on a p-type silicon substrate 11, a p$^+$ layer 24 containing aluminum as an impurity is formed by the diffusion of aluminum atoms within the substrate 11. A solar cell 10 can thereby be manufactured.

EXAMPLES

Examples of the invention are described below, although these examples are not intended to limit the invention.

Preparation of Tellurium-Loaded Glass Frit

A glass frit made of lead-based (Pb-based) glass having an average particle diameter of 1.1 μm and containing 38 mol % PbO, 32 mol % SiO$_2$ and 12 mol % Li$_2$O was prepared.

Telluric acid powder (Te(OH)$_6$, from Kisan Kinzoku Chemicals Co., Ltd.; purity, 99%) having an average particle diameter of 5 μm was furnished as the tellurium compound.

Sixty parts by mass of Te(OH)$_6$ was mixed together with 100 parts by mass of the glass frit. This represents a tellurium oxide (TeO$_2$) equivalent mass of about 40 parts by mass. In accordance with the sequence of operations shown in FIG. 1, these materials were mixed together, then spread out in a vat and sintered at 450° C. for about 30 minutes. Because the resulting sintered material had formed into agglomerates due to sintering, they were mildly disintegrated (broken up) by hand. The material that passed through a #150 screen was used as the tellurium-loaded glass fit. The sintering temperature was set to the melting point Tm of the glass frit (450° C.).

SEM Examination

The tellurium-loaded glass frit prepared as described above and a mixture of glass frit and telluric acid powder prior to sintering of the tellurium-loaded glass frit were both examined with a scanning electron microscope (SEM). FIG. 2 shows the results of SEM examination of the tellurium-loaded glass frit, and FIG. 3 shows the results of SEM examination of the unsintered mixture.

As is apparent from FIG. 2, in the tellurium-loaded glass frit, the proportion of agglomerated tellurium compound particles is small, indicating that these particles are relatively uniformly dispersed and supported so as to stick to the surface of the glass fit. It was also possible to observe that the tellurium compound particles have lost roundness compared with those in FIG. 3, and that the tellurium compound particles and the glass frit are bonded so as to form necks at bonding portion therebetween.

By contrast, in the unsintered mixture in FIG. 3, the tellurium compound can be seen to be in a mixed state with glass frit while retaining the form of round particles. It was also observed that, although the tellurium compound is in the form of round particles and there are areas where the glass frit and the tellurium compound particles are in mutual contact, they are present together without being united.

X-Ray Diffraction Analysis

X-ray diffraction (XRD) analysis was carried out on the tellurium-loaded glass fit prepared as described above and the mixture prior to sintering of this tellurium-loaded glass frit. XRD analysis was carried out with an x-ray diffractometer (Ultrax18-TTR3-300, from Rigaku Corporation) using the CuKα line as the line source. Measurement was carried out over a range in the measurement angle 2θ of 0° to 60°. FIG. 4 shows the x-ray diffraction pattern obtained for tellurium-loaded glass frit, and FIG. 5 shows the x-ray diffraction pattern obtained for the unsintered mixture.

In the x-ray diffraction pattern for the unsintered mixture in FIG. 5, a sharp peak for telluric acid was detected, confirming that glass and telluric acid are present without being united.

By contrast, the x-ray diffraction pattern for the tellurium-loaded glass fit in FIG. 4 is such that the peak pattern for the crystals overlaps with the halo pattern; the diffraction peaks obtained were peaks attributable to the tellurium-containing oxides Pb$_3$TeO$_5$, Te$_2$O$_5$ and TeO$_3$. That is, it was possible to confirm the presence in tellurium-loaded glass frit of (1) a glass phase from glass fit, (2) a phase composed of tellurium oxides (Te$_2$O$_5$ and TeO$_3$) which formed as a result of the sintering of telluric acid, and (3) a tellurium-containing compound (Pb$_3$TeO$_5$) composed of a glass frit constituent and a telluric acid constituent. When combined with the results of the above SEM observations, it appears that the tellurium-containing compound (3) has formed at interfaces between the glass phase and the tellurium oxides.

Production of Unfired Film for Evaluation

Paste Composition A

Silver particles having an average particle diameter (D50) of 2 μm (AG48F, from DOWA Electronics) were furnished as the silver powder.

An organic vehicle composed of a binder (ethyl cellulose) and an organic solvent (terpineol) was furnished as the organic medium.

In accordance with the sequence of operations shown in FIG. 6, a paste composition was prepared by adding 3.5 parts by mass of the tellurium-loaded glass frit furnished above to 100 parts by mass of this silver powder, and mixing these together with the organic medium. The binder here was included in an amount of 6 parts by mass per 100 parts by mass of the silver powder and tellurium-loaded glass frit combined, with the balance being organic solvent. A silver electrode-forming paste composition, designated below as "Paste Composition A," was thereby obtained.

Paste Composition B

A paste composition was prepared by mixing 2 parts by mass of the same glass frit as that furnished above (i.e., glass fit on which tellurium is not supported) and 1 part by mass of telluric acid together with 100 parts by mass of silver powder, then mixing these together with an organic medium. Here too, the organic medium was formulated in such a way as to include the binder in a mass that is equivalent to the combined amount of silver powder and tellurium-loaded glass fit. A silver electrode-forming paste composition, designated below as "Paste Composition B," was thereby obtained.

Formation of Coats for Evaluation

Paste Compositions A and B prepared above were each printed onto the surfaces of silicon substrates and dried at 85° C. to drive off the organic solvent, thereby producing Coats A and B, respectively.

Energy-Dispersive X-Ray Diffraction

Coats A and B prepared above were cut together with the substrate, and the respective cut faces were analyzed by energy-dispersive x-ray diffraction method (EDX). An SEM-EDX system (SEM: S-4700 from Hitachi High-Tech Fielding Corporation; EDX: X-max from Horiba, Ltd.) was used for analysis. Analytic results obtained with the SEM-EDX system are shown in FIGS. 7A to 8C. FIG. 7A shows the results of SEM examination of the cut face of Coat A, FIG. 7B shows the EDX spectrum at the position indicated by T in FIG. 7A, and FIG. 7C shows the EDX spectrum at the position indicated by G in FIG. 7A. FIG. 8A shows the results of SEM examination of the cut face of Coat B, FIG. 8B shows the EDX spectrum at the position indicated by T in FIG. 8A, and FIG. 8C shows the EDX spectrum at the position indicated by G in FIG. 8A.

Position T in FIG. 7A, from the results of SEM examination, is a position that appears to be near an interface between a piece of glass fit and a tellurium compound (e.g., tellurium oxide, a tellurium-containing compound), and position G is near the center of a piece of glass frit. From FIGS. 7B and C, in Coat A prior to firing, much tellurium and some lead, which is a constituent of the glass, were detected near interfaces between pieces of glass fit and tellurium compound in tellurium-loaded glass frit. In addition, much lead was detected near the centers of pieces of glass frit.

Position T in FIG. 8A, from the results of SEM examination, is a position that appears to be near the center of telluric acid, and position G is at the edge of a piece of glass fit. From FIGS. 8B and C, it was possible to confirm that, in the glass fit component (Pb) and the telluric acid portion of Coat B prior to firing, the respective ingredients are separately detected.

It was possible to confirm from these results that, although the materials used in preparing pastes for Coats A and B were the same, the coats that formed had entirely different structures.

Production of Silver Electrode Film

Furnishing the Glass Components

Glass Component a: A glass frit made of lead-based (Pb-based) glass composed of 38 mol % PbO, 32 mol % $SiO_2$, and 12 mol % $Li_2O$ was furnished. This was designated as "Glass Component a."

Glass Component b: A sintered material composed of a tellurium compound supported on glass fit was prepared by mixing 60 parts by mass of $Te(OH)_2$ with 100 parts by mass of above Glass Component a, then sintering at 450° C. for about 30 minutes. This sintered material was lightly disintegrated. The portion that passed through a #150 screen was designated as "Glass Component b" (tellurium-loaded glass fit).

Glass Component c: A glass frit made of lead-tellurium-based (Pb—Te-based) glass composed of 52 mol % PbO and 36 mol % $TeO_2$ was furnished. This was designated as "Glass Component c."

Preparation of Paste Composition (1) Silver particles having an average particle diameter (D50) of 2 μm (AG48F, from DOWA Electronics) were furnished as the silver powder.

(2) One of Glass Components a to c prepared above was used as the glass component.

(3) Nickel particles having an average particle diameter (D50) of 0.15 μm (117X, from JFE Mineral Co., Ltd.) were furnished as an added ingredient.

(4) An organic vehicle composed of a binder (ethyl cellulose) and an organic solvent (terpineol) was furnished as the organic medium.

Sample 1:

A paste composition (Sample 1) was obtained by mixing together the (1) silver powder, (2) Glass Component b (tellurium-loaded glass frit), and (3) nickel particles furnished as described above, and kneading the mixture together with (4) the organic medium. The respective materials were compounded in the following proportions per 100 mass % of the overall paste composition: 85 mass % of silver powder, 2 mass % of Glass Component b, and 0.06 mass % of nickel particles, with the balance being organic medium. The organic medium was prepared in such a way that the amount of binder was 6 parts by mass per 100 parts by mass of paste composition solids, with the balance being organic solvent.

Sample 2:

A paste composition (Sample 2) was obtained by using above Glass Component c (Pb—Te-based glass frit) instead of Glass Component b in Sample 1, with the other conditions being the same as for Sample 1.

Sample 3:

A paste composition (Sample 3) was obtained by using Glass Component a (Pb-based glass frit) instead of Glass Component b in Sample 1 and adding $TeO_2$, with the other conditions being the same as for Sample 1. Glass Component a and $TeO_2$ were mixed together in proportions, based on 100 mass % for the overall paste composition, of 2 mass % of Glass Component a and 1 mass % of $TeO_2$.

Fabrication of Solar Cells for Evaluation

Solar cells for evaluation were fabricated as described below using the paste compositions of Samples 1 to 3 obtained above as pastes for the formation of light-receiving surface electrodes.

First, a commercially available p-type monocrystalline silicon substrate for a solar cell measuring 156 mm square (substrate thickness, 180 μm) was furnished for use, and the surface was subjected to acid etching treatment using a mixed acid obtained by mixing together hydrofluoric acid and nitric acid. Next, a phosphorus-containing solution was applied to the light-receiving surface of the silicon substrate on which a finely textured structure had been formed by the etching treatment, and an n-Si layer ($n^+$ layer) having a thickness of about 0.5 μm was formed on the light-receiving surface of the silicon substrate by carrying out heat treatment (see FIG. 9). An anti-reflective coating (silicon nitride film) having a thickness of about 80 nm was formed by plasma-enhanced CVD (PECVD) on this n-Si layer.

Next, coats (having thicknesses of at least 10 μm but not more than 30 μm) intended to serve as light-receiving surface electrodes (silver electrodes) were formed by screen printing the paste compositions of Samples 1 to 3 obtained above onto the anti-reflective coating. In addition, coats intended to serve as back-surface electrodes (silver electrodes) were similarly formed in a given pattern. These coats were dried at 85° C., and the resulting workpieces were furnished to the next step (see FIG. 9).

A given aluminum paste for a back-surface electrode was then printed (applied) by screen printing (using a stainless steel SUS #165 screen mesh; the same applies below) so as to overlap with part of the silver electrode pattern on the back side of the silicon substrate, thereby forming a coat having a thickness of about 55 μM. Next, this silicon substrate was fired, thereby forming a solar cell having silver electrodes (light-receiving surface electrodes). Firing was carried out using a near-infrared high-speed kiln in an open-air atmosphere and at a firing temperature of at least 700° C. but not more than 800° C. Solar cells for evaluation were thereby obtained.

The solar cells fabricated using the paste compositions of Samples 1 to 3 are correspondingly referred to below as, respectively, the solar cells of Samples 1 to 3.

Fill Factor and Energy Conversion Efficiency

Using a solar simulator (PSS 10, from Berger Lichttechnik GmbH & Co.), the I-V characteristics of the solar cells of Samples 1 to 3 were measured. The fill factor (FF) and the energy conversion efficiency (Eff) were determined from the I-V curve thus obtained. The FF value and the Eff value were calculated based on the "Method of Measuring the Output of Crystalline Solar Cells" set forth in JIS C-8913.

Table 1 shows the results of FF value and Eff value calculations expressed in the form of percentages. These results are average values for 100 data points obtained with the solar simulator. The conversion efficiency Eff is shown in FIG. 11 as well.

Bond Strength

Next, the bond strengths of the silver electrodes in the solar cells of Samples 1 to 3 fabricated as described above were determined. Measurements of the silver electrode bond strengths (peel strength) were carried out using a strength measuring device 300 like that shown in FIG. 10.

Specifically, a glass substrate 41 was fastened to a holder 40 in the strength measuring device 300 shown in FIG. 10 by fastening screws 43 and a locking plate 44. The solar cell 10 to be evaluated was then mounted on the glass substrate 41 with the light-receiving surface side facing upward and the back surface side facing downward, and attached thereto with an intervening epoxy adhesive 42.

A tab wire 35 was soldered, through a solder layer 30, onto a silver electrode 12 positioned on the top side of the solar cell for evaluation attached onto the glass substrate 41, and further attached to this electrically conductive bonding film 30.

Next, as shown in FIG. 10, the strength measuring device 300 was inclined so as to set the bottom side of the holder 40 to an angle of 135°, and the bond strength of the tab wire 35/solder layer 30/silver electrode 12 was measured by pulling an already formed extension 35e of the tab wire 35 vertically upward (see arrow 45). The results of bond strength measurements are shown in Table 1 and FIG. 12.

TABLE 1

| Sample | Glass component | Added ingredients | Form in which Te component is included | FF (%) | Adhesive strength (N) |
|---|---|---|---|---|---|
| 1 | Te compound-loaded Pb-based glass | Ni | supported on glass component | 78.43 | 4.1 |
| 2 | Pb—Te-based glass | Ni | glass former | 78.42 | 2.1 |
| 3 | Pb-based glass | TeO$_2$, Ni | mixed with glass component | 77.93 | 4.1 |

Evaluation

The tellurium component is included in the same proportion in each of the paste compositions of Samples 1 to 3, although the form in which the tellurium component is present in the paste composition differs in each case. That is, in the paste composition of Sample 1, the tellurium component is present in a state that is supported on the surface of the glass frit and united therewith, although most of the tellurium component maintains an independent state from the glass fit (glass phase). In the paste composition of Sample 2, all of the tellurium component is included as a glass former, and is included substantially homogeneously within the glass frit (glass phase). In the paste composition of Sample 3, the tellurium component is a solitary compound independent of other materials such as glass frit and silver powder, and is included in the state of a mixture with these materials.

The fill factor (FF) is basically an indicator of the quality of the solar cell. The fill factor typically falls within the range of at least 70% but not more than 80%. In regions where this value is in the upper half of this range, increasing the FF value by even 0.01% greatly improves the performance as a solar cell. It was confirmed from the results in Table 1 that, depending on the form in which the tellurium component is included within the paste composition, there are large differences in the FF value obtained. That is, when the tellurium component was included within the paste composition in a mixed state (Sample 3), the FF value was 77.93%, which was a relatively low. However, when the tellurium component was included as part of the glass component (Samples 1 and 2), the FF value was, for example, about 78.4%, which is relatively high. From these results, it was possible to confirm that the FF value-improving effect can be further manifested by either including the tellurium component in the glass phase as part of the glass component within the paste composition or having the tellurium component present at positions very close to the glass phase.

Results substantially like those for the fill factor were obtained also for the conversion efficiency (Eff). That is, the Eff values were at least 0.1% higher for Samples 1 and 2 which included tellurium as part of the glass component than for Sample 3 which included tellurium in a that is physically separate from the glass component. Hence, it was possible to confirm that the conversion efficiency increases when tellurium is included in the glass phase or is present at positions very close to the glass phase.

In addition, it was possible to confirm from Table 1 that, depending on the form in which the tellurium component is present within the paste composition, large differences emerge in the bond strength of the silver electrode that forms. That is, it was found that, in cases where the tellurium component is completely incorporated within the glass phase and acts as a glass former (Sample 2), the bond strength of the silver electrode ends up being, for example, 2.1 N, which is a very low value. However, in cases where the tellurium component is not completely incorporated within the glass phase and is present independent of the glass phase (Samples 1 and 3), a high bond strength of, for example, 4.1 N is obtained. From this, it was possible to confirm that a high bond strength can be maintained by having some tellurium component be present within the paste composition without being incorporated within the glass phase.

In the paste composition of Sample 1, the tellurium component is supported on the surface of glass powder and is not all incorporated within the glass phase. Hence, the tellurium component is present, as part of the glass component, at positions very close to the glass phase. It was confirmed that a FF value-increasing effect and a high bond strength can both be achieved for silver electrodes that are formed using such a paste composition.

Samples 4 to 13

Aside from using the added ingredients shown in Table 2 instead of the nickel particles (Ni particles) in Sample 1, paste compositions (Samples 4 to 13) were obtained under the same conditions as for Sample 1.

That is, the paste composition in Sample 4 contained no added ingredients, this being a paste composition in which the Ni particles were excluded from the paste composition of Sample 1.

The paste composition of Sample 5 was obtained by replacing the Ni particles in Sample 1 with the same amount of NiO particles.

The paste composition of Sample 6 was obtained by replacing the Ni particles in Sample 1 with the same amount of Ti particles.

The paste composition of Sample 7 was obtained by replacing the Ni particles in Sample 1 with the same amount of $Fe_2O_3$ particles.

The paste composition of Sample 8 was obtained by replacing the Ni particles in Sample 1 with the same amount of ZnO particles.

The paste composition of Sample 9 was obtained by replacing the Ni particles in Sample 1 with Cu particles in a proportion of 0.03 mass %, based on the overall paste composition.

The paste composition of Sample 10 was obtained by replacing the Cu particles in Sample 9 with the same amount of CuO particles.

The paste composition of Sample 11 was obtained by replacing the Cu particles in Sample 9 with the same amount of $MnO_2$ particles.

The paste composition of Sample 12 was obtained by replacing the Cu particles in Sample 9 with the same amount of $Mn_2O_3$ particles.

The paste composition of Sample 13 was obtained by replacing the Cu particles in Sample 9 with the same amount of $Mn_3O_4$ particles.

Fabrication of Solar Cells for Evaluation

Using the paste compositions of Samples 4 to 13 obtained above as the light-receiving surface electrode-forming paste, solar cells for evaluation were fabricated in the same way as in Samples 1 to 3 above. The solar cells for evaluation fabricated using the paste compositions of Samples 4 to 13 are correspondingly referred to below as, respectively, the solar cells of Samples 4 to 13.

Evaluation

The fill factors (FF) for the solar cells of Samples 4 to 13 were calculated in the same way as for above Samples 1 to 3, in addition to which the bond strengths of the silver electrodes on the light-receiving surfaces of these solar cells were measured. The results are shown in Table 2. The results for the solar cell of Sample 1 are shown together in Table 2 for the sake of reference.

TABLE 2

| Sample | Glass component | Added ingredients | Mass % | FF (%) | Adhesive strength (N) |
|---|---|---|---|---|---|
| 1 | Te compound-loaded Pb-type glass | Ni | 0.06 | 78.43 | 4.1 |
| 4 | | — | — | 76.22 | 2.5 |
| 5 | | NiO | 0.06 | 78.42 | 4.2 |
| 6 | | Ti | 0.06 | 78.43 | 4.1 |
| 7 | | $Fe_2O_3$ | 0.06 | 78.41 | 4 |
| 8 | | ZnO | 0.06 | 78.31 | 3.4 |
| 9 | | Cu | 0.03 | 78.39 | 3.5 |
| 10 | | CuO | 0.03 | 78.32 | 3.6 |
| 11 | | $MnO_2$ | 0.03 | 78.40 | 4.2 |
| 12 | | $Mn_2O_3$ | 0.03 | 78.42 | 4.1 |
| 13 | | $Mn_3O_4$ | 0.03 | 78.42 | 4.2 |

From Table 2, it was possible to confirm that both the fill factor and the bond strength are improved by adding to the paste composition, as an added ingredient, a very small amount of a Periodic Table group 4 transition metal element, either in uncombined form or as an oxide thereof. The uncombined transition metal element or oxide thereof is able, in each case, to form a good silver electrode film having a high fill factor and a high bond strength. However, when Ni, NiO, Ti, $Mn_2O_3$ or $Mn_3O_4$ in particular was added, the fill factor was 78.42% or more and the bond strength was 4.1 N or more, indicating that a good silver electrode film was obtained.

This invention provides a silver electrode-forming paste composition which contains a glass component made up of glass frit on which a tellurium compound is supported. By using such a paste composition to form silver electrodes in a solar cell (on the light-receiving surface and the back surface), it is possible to form silver electrode films having a high bond strength and good electrode characteristics (such as achieving a high fill factor), enabling high-quality solar cells to be achieved.

What is claimed is:

1. A paste composition for forming a silver electrode comprising:
   a silver powder;
   a glass component, the glass component including tellurium-loaded glass frit composed of glass frit and a tellurium compound supported on surfaces of the glass frit; and
   an organic medium.

2. The paste composition of claim 1, wherein
   the tellurium-loaded glass fit has at least
   a glass phase including, as a principal component, glass that does not contain tellurium (Te) as a glass network-forming element; and
   a tellurium compound phase including, as a principal component, a tellurium compound, and
   the glass phase and the tellurium compound phase are united through an interface.

3. The paste composition of claim 1, wherein
   the tellurium-loaded glass frit is formed by sintering a mixture of the glass frit and a tellurium starting compound for forming the tellurium compound.

4. The paste composition of claim 3, wherein, letting Tm be the melting point of the glass fit, the mixture is sintered in the temperature range of (Tm−35°) C. to (Tm+20)° C.

5. The paste composition of claim 1, wherein
the tellurium compound in the tellurium-loaded glass fit is supported in a mass ratio per 100 parts by mass of the glass frit, in terms of tellurium oxide ($TeO_2$), of from 20 to 60 parts by mass.

6. The paste composition of claim 1, wherein
the tellurium-loaded glass frit is compounded in a molar ratio with respect to the silver powder, expressed as Ag:Te, in the range of from 1:0.001 to 1:0.1.

7. The paste composition of claim 1, wherein
the diffraction pattern for the glass component obtained by x-ray diffraction analysis includes, within a halo pattern from the glass frit, a peak attributable to the tellurium compound.

8. The paste composition according to claim 7, wherein
the diffraction pattern for the glass component obtained by x-ray diffraction analysis further includes a peak attributable to a tellurium-containing compound composed of the glass fit and the tellurium compound.

9. The paste composition of claim 1, further comprising at least one type of powder selected from the group consisting of transition metal powders and transition metal oxide powders.

10. A method of producing a paste composition, for forming a silver electrode of a solar cell, including a silver powder, a glass component and an organic medium, the method comprising:
mixing together glass frit and a tellurium starting compound to arrange a mixture,
sintering the mixture, letting Tm° C. be the melting point of the glass frit, in the temperature range of (Tm−35)° C. to (Tm+20)° C. to prepare tellurium-loaded glass fit composed of glass fit and a tellurium compound supported on surfaces of the glass frit; and
dispersing the glass component and the silver powder in the organic medium using the tellurium-loaded glass frit as at least part of the glass component.

11. The production method of claim 10, further comprising:
disintegrating the tellurium-loaded glass frit.

12. A solar cell comprising an electrode formed by using the paste composition of claim 1.

13. The solar cell according to claim 12, wherein
the electrode is a light-receiving surface electrode.

* * * * *